United States Patent
Suzuki

(10) Patent No.: US 10,038,020 B2
(45) Date of Patent: Jul. 31, 2018

(54) SOLID-STATE IMAGE SENSOR

(71) Applicant: NIKON CORPORATION, Tokyo (JP)

(72) Inventor: Satoshi Suzuki, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/447,756

(22) Filed: Mar. 2, 2017

(65) Prior Publication Data

US 2017/0179175 A1   Jun. 22, 2017

Related U.S. Application Data

(63) Continuation of application No. 14/436,133, filed as application No. PCT/JP2013/078483 on Oct. 21, 2013, now Pat. No. 9,620,558.

(30) Foreign Application Priority Data

Oct. 19, 2012   (JP) ................. 2012-232422

(51) Int. Cl.
| | |
|---|---|
| *H01L 27/146* | (2006.01) |
| *H01L 27/148* | (2006.01) |
| *H04N 5/378* | (2011.01) |
| *H04N 5/357* | (2011.01) |

(52) U.S. Cl.
CPC .. *H01L 27/14614* (2013.01); *H01L 27/14643* (2013.01); *H01L 27/14812* (2013.01); *H04N 5/3575* (2013.01); *H04N 5/378* (2013.01)

(58) Field of Classification Search
CPC ......... H01L 27/14614; H01L 27/14812; H01L 27/14643; H04N 5/3575; H04N 5/378
USPC ....................................................... 257/225
See application file for complete search history.

(56) References Cited

U.S. PATENT DOCUMENTS

| | | | |
|---|---|---|---|
| 2001/0039061 A1 | 11/2001 | Suzuki et al. | |
| 2009/0290059 A1 | 11/2009 | Suzuki | |
| 2012/0193515 A1* | 8/2012 | Agranov | ................. G01S 3/782 |
| | | | 250/208.1 |
| 2013/0021499 A1 | 1/2013 | Ui et al. | |

FOREIGN PATENT DOCUMENTS

| | | |
|---|---|---|
| JP | 2002-314062 A | 10/2002 |
| JP | 2007-127746 A | 5/2007 |
| (Continued) | | |

OTHER PUBLICATIONS

Dec. 17, 2013 International Search Report issued in International Patent Application No. PCT/JP2013/078483.
(Continued)

*Primary Examiner* — Fernando L Toledo
*Assistant Examiner* — Adam S Bowen
(74) *Attorney, Agent, or Firm* — Oliff PLC

(57) ABSTRACT

A solid-state image sensor includes: a pixel array that includes first pixels, each having first and second photoelectric conversion units, and second pixels, each having third and fourth photoelectric conversion units; first to fourth transfer gates via which a signal charge respectively generated in the first to fourth photoelectric conversion units is respectively transferred to first to fourth charge voltage conversion units. At least one of a gate width, a gate length and an installation position of at least one transfer gate among the first to fourth transfer gates is altered to achieve uniformity in voltage conversion efficiency at the first to fourth charge voltage conversion units.

38 Claims, 7 Drawing Sheets

(56) References Cited

FOREIGN PATENT DOCUMENTS

| | | | |
|---|---|---|---|
| JP | 2007-317951 A | | 12/2007 |
| JP | 2008-193527 A | | 8/2008 |
| JP | 2008-270298 A | | 11/2008 |
| JP | 2008270298 A | * | 11/2008 |
| JP | 2011-221253 A | | 11/2011 |

OTHER PUBLICATIONS

Feb. 26, 2016 Office Action issued in U.S. Appl. No. 14/436,131.
Aug. 12, 2016 Search Report issued in European Patent Application No. 13 84 6627.1.
Oct. 4, 2016 Office Action issued in Japanese Patent Application No. 2014-542210.
Dec. 13, 2016 Office Action issued in Chinese Patent Application No. 201380066713.1.
Sep. 26, 2017 Office Action issued in Japanese Application No. 2017-087402.
Aug. 2, 2017 Office Action issued in Chinese Application No. 201380066713.1.

* cited by examiner

SOLID-STATE IMAGE SENSOR

This application is a Continuation Application of U.S. patent application Ser. No. 14/436,133, filed Jul. 30, 2015, which is a National Phase Application of PCT/JP2013/078483, filed Oct. 21, 2013, and claims priority to Japanese Patent Application No. 2012-232422, filed Oct. 19, 2012, the content of which is incorporated herein by reference.

TECHNICAL FIELD

The present invention relates to a solid-state image sensor.

BACKGROUND ART

A solid-state image sensor such as a CMOS image sensor is used in a video camera or a digital still camera. A solid-state image sensor normally includes pixels arranged in a matrix pattern, having photoelectric conversion units disposed therein that generate electric charges corresponding to the amount of incident light. Solid-state image sensors known in the related art include those with a single photoelectric conversion unit disposed at each pixel and those with two or more photoelectric conversion units disposed at each pixel (see PTL1).

The electric charge generated at each photoelectric conversion unit is transferred via a transfer gate to a corresponding FD (floating diffusion) area. The electric charge is converted to a voltage depending on FD area capacitance and the converted voltage signal is then read as a photoelectric conversion signal.

CITATION LIST

Patent Literature

PTL 1: Japanese Laid Open Patent Publication No, 2008-193527

SUMMARY OF INVENTION

Technical Problem

When two photoelectric conversion units are disposed at each pixel, the two photoelectric conversion units may be arranged side-by-side along the horizontal direction (horizontal division) or arranged side-by-side along the vertical direction (vertical division). In order to ensure that uniform photoelectric conversion characteristics are achieved through the individual photoelectric conversion units, the two photoelectric conversion units take on shapes and the sizes such that symmetry is achieved within the pixel. In more specific terms, the two photoelectric conversion units disposed side-by-side along the horizontal direction in a horizontal division pixel achieve left/right symmetry, whereas the photoelectric conversion units disposed side-by-side along the vertical direction in a vertical division pixel achieve up/down symmetry. However, there is an issue yet to be effectively addressed in that variance is bound to occur among photoelectric conversion signals provided from the photoelectric conversion units in the horizontal division pixels from the photoelectric conversion units in the vertical division pixels even if these photoelectric conversion units assume matching shapes and sizes.

Solution to Problem

According to the 1st aspect of the present invention, a solid-state image sensor comprises: a pixel array that includes first pixels, each having a first photoelectric conversion unit and a second photoelectric conversion unit arranged along a first direction, and second pixels, each having a third photoelectric conversion unit and a fourth photoelectric conversion unit arranged along a second direction; a first transfer gate via which a signal charge generated in the first photoelectric conversion unit is transferred to a first charge voltage conversion unit; a second transfer gate via which a signal charge generated in the second photoelectric conversion unit is transferred to a second charge voltage conversion unit; a third transfer gate via which a signal charge generated in the third photoelectric conversion unit is transferred to a third charge voltage conversion unit; and a fourth transfer gate via which a signal charge generated in the fourth photoelectric conversion unit is transferred to a fourth charge voltage conversion unit, wherein: at least one of a gate width, a gate length and an installation position of at least one transfer gate among the first transfer gate, the second transfer gate, the third transfer gate and the fourth transfer gate is altered so as to achieve uniformity in voltage conversion efficiency at the first charge voltage conversion unit, the second charge voltage conversion unit, the third charge voltage conversion unit and the fourth charge voltage conversion unit.

According to the 2nd aspect of the present invention, in the solid-state image sensor according to the 1st aspect, it is preferred that the first direction and the second direction are perpendicular to each other.

According to the 3rd aspect of the present invention, in the solid-state image sensor according to the 1st or the 2nd aspect, it is preferred that the first transfer gate and the second transfer gate are formed so as to assume a substantially identical gate width or gate length, the third transfer gate and the fourth transfer gate are formed so as to assume a substantially identical gate width or gate length, and installation positions at which the first transfer gate and the second transfer gate are disposed in the first pixels and installation positions at which the third transfer gate and the fourth transfer gate are disposed in the second pixels are substantially identical.

According to the 4th aspect of the present invention, in the solid-state image sensor according to the 3rd aspect, it is preferred that: the first photoelectric conversion unit, the second photoelectric conversion unit, the third photoelectric conversion unit and the fourth photoelectric conversion unit are formed to achieve substantially identical dimensions; and the first transfer gate and the second transfer gate are disposed respectively at longer sides of the first photoelectric conversion unit and the second photoelectric conversion unit in the first pixels, and the third transfer gate and the fourth transfer gate are disposed respectively at shorter sides of the third photoelectric conversion unit and the fourth photoelectric conversion unit in the second pixels.

According to the 5th aspect of the present invention, in the solid-state image sensor according to the 3rd aspect, it is preferred that: the first photoelectric conversion unit, the second photoelectric conversion unit, the third photoelectric conversion unit and the fourth photoelectric conversion unit are formed to achieve substantially identical dimensions; and the first transfer gate and the second transfer gate are disposed at corners located at ends of a diagonal running through the first pixels and the third transfer gate and the fourth transfer gate are disposed at corners located at ends of a diagonal running through second pixels.

According to the 6th aspect of the present invention, in the solid-state image sensor according to the 1st or the 2nd aspect, it is preferred that: the first transfer gate and the second transfer gate are disposed in the first pixels at positions different from installation positions at which the third transfer gate and the fourth transfer gate are disposed in the second pixels; and a gate width or a gate length of transfer gates made up with the first transfer gate and the second transfer gate and a gate width or a gate length of transfer gates made up with the third transfer gate and the fourth transfer gate are varied in correspondence to a length of sides of the first photoelectric conversion unit and the second photoelectric conversion unit at which the first transfer gate and the second transfer gate are disposed and a length of sides of the third photoelectric conversion unit and the fourth photoelectric conversion unit at which the third transfer gate and the fourth transfer gate are disposed.

According to the 7th aspect of the present invention, a solid-state image sensor comprises: first pixels each including a first photoelectric conversion unit, which includes photoelectric conversion areas divided from each other along a horizontal direction, and a plurality of first transfer gates via which electric charges resulting from photoelectric conversion executed in the first photoelectric conversion unit are transferred to first charge voltage conversion units from the first photoelectric conversion unit; and second pixels each including a second photoelectric conversion unit, which includes photoelectric conversion areas divided from each other along a vertical direction, and a plurality of second transfer gates via which electric charges resulting from photoelectric conversion executed in the second photoelectric conversion unit are transferred to second charge voltage conversion units from the second photoelectric conversion unit, wherein: installation positions at which the first transfer gates are disposed at each of the first pixels are substantially identical to installation positions at which the second transfer gates are disposed at each of the second pixels.

According to the 8th aspect of the present invention, a solid-state image sensor comprises: first pixels each including a first photoelectric conversion unit, which includes photoelectric conversion areas divided from each other along a horizontal direction, and a plurality of first transfer gates via which electric charges resulting from photoelectric conversion executed in the first photoelectric conversion unit are transferred to first charge voltage conversion units from the first photoelectric conversion unit; and second pixels each including a second photoelectric conversion unit, which includes photoelectric conversion areas divided from each other along a vertical direction, and a plurality of second transfer gates via which electric charges resulting from photoelectric conversion executed in the second photoelectric conversion unit are transferred to second charge voltage conversion units from the second photoelectric conversion unit, wherein: a gate width or a gate length assumed for the first transfer gates is different from the gate width or the gate length assumed for the second transfer gates so as to achieve uniformity in voltage conversion efficiency among the first charge voltage conversion units and the second charge voltage conversion units.

Advantageous Effects of Invention

Variance among photoelectric conversion signals provided from pixels, each having a plurality of photoelectric conversion units disposed thereat, can be minimized in the solid-state image sensor according to the present invention.

DESCRIPTION OF EMBODIMENTS

The following is a description of embodiments of the present invention, given in reference to drawings.

First Embodiment

Figure 1:
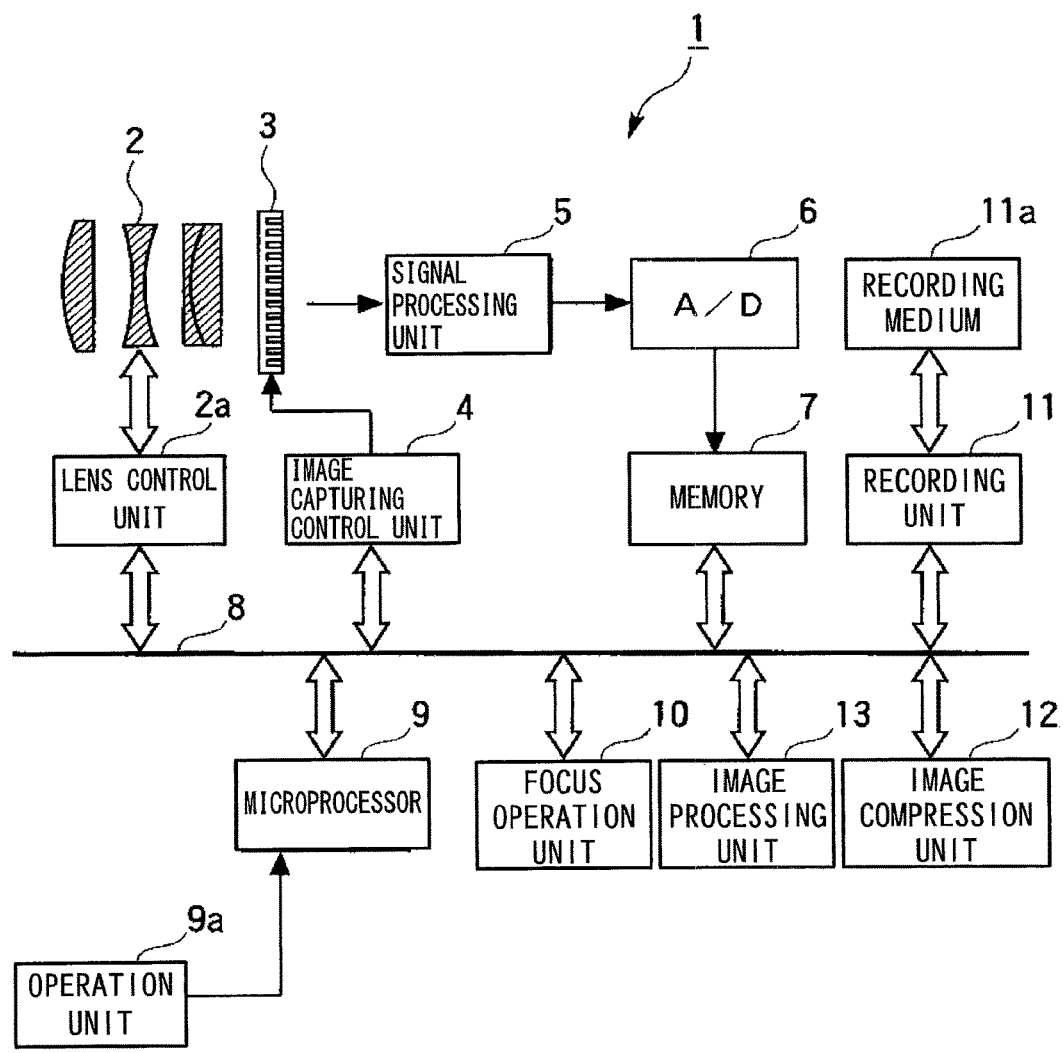
FIG. 1 A block diagram presenting an example of a digital camera in which a solid-state image sensor achieved in a first embodiment of the present invention may be installed FIG. 2 A schematic illustration of the structure adopted in the solid-state image sensor FIG. 3 A circuit diagram pertaining to pixels adjacent to each other along the vertical direction in FIG. 1

FIG. 1 is a block diagram presenting an example of a digital camera 1 in which a solid-state image sensor 3 achieved in the first embodiment of the present invention may be installed. A photographic lens 2 mounted at the digital camera 1 functions as an image-capturing optical system. At the photographic lens 2, a lens control unit 2$a$ executes drive control for a focusing lens and an aperture in response to instructions received from a microprocessor 9. The photographic lens 2 forms a subject image on an image-capturing surface of the solid state image sensor 3.

The solid-state image sensor 3 executes photoelectric conversion for the subject image based upon a drive signal provided by an image-capturing control unit 4 upon receiving an instruction from the microprocessor 9. Photoelectric conversion signals output from the solid-state image sensor 3 are first processed via a signal processing unit 5 and an A/D conversion unit 6, and are then temporarily stored into a memory 7. The lens control unit 2$a$, the image-capturing control unit 4, the memory 7, the microprocessor 9, a focus operation unit (focus detection processing unit) 10, a recording unit 11, an image compression unit 12, an image processing unit 13 and the like are connected to a bus 8.

An operation signal output from an operation unit 9$a$, such as a shutter release button, is input to the microprocessor 9. Based upon the operation signal input thereto from the operation unit 9$a$, the microprocessor 9 transmits instructions to various blocks so as to control photographing operations executed in the digital camera 1. The focus operation unit 10 executes phase difference detection operation by using signals output from pixels formed at the solid-state image sensor 3 and detects the focusing condition (more specifically a defocus amount) achieved through the photographic lens 2. The phase difference detection operation executed in this situation is similar to that disclosed in Japanese Laid Open Patent Publication No. 2007-317951 and thus, a special explanation is not provided. In correspondence to the defocus amount thus detected, the microprocessor 9 issues a focusing lens drive instruction to the lens control unit 2$a$.

The image processing unit 13 executes specific image processing on the photoelectric conversion signals stored in the memory 7. Image data resulting from the image processing are compressed in a predetermined format by the image compression unit 12. The recording unit 11 records the compressed image data into a recording medium 11a in a specific file format. The recording medium 11a is constituted with a detachable memory card or the like that can be loaded into and removed from the recording unit 11.

Figure 2:
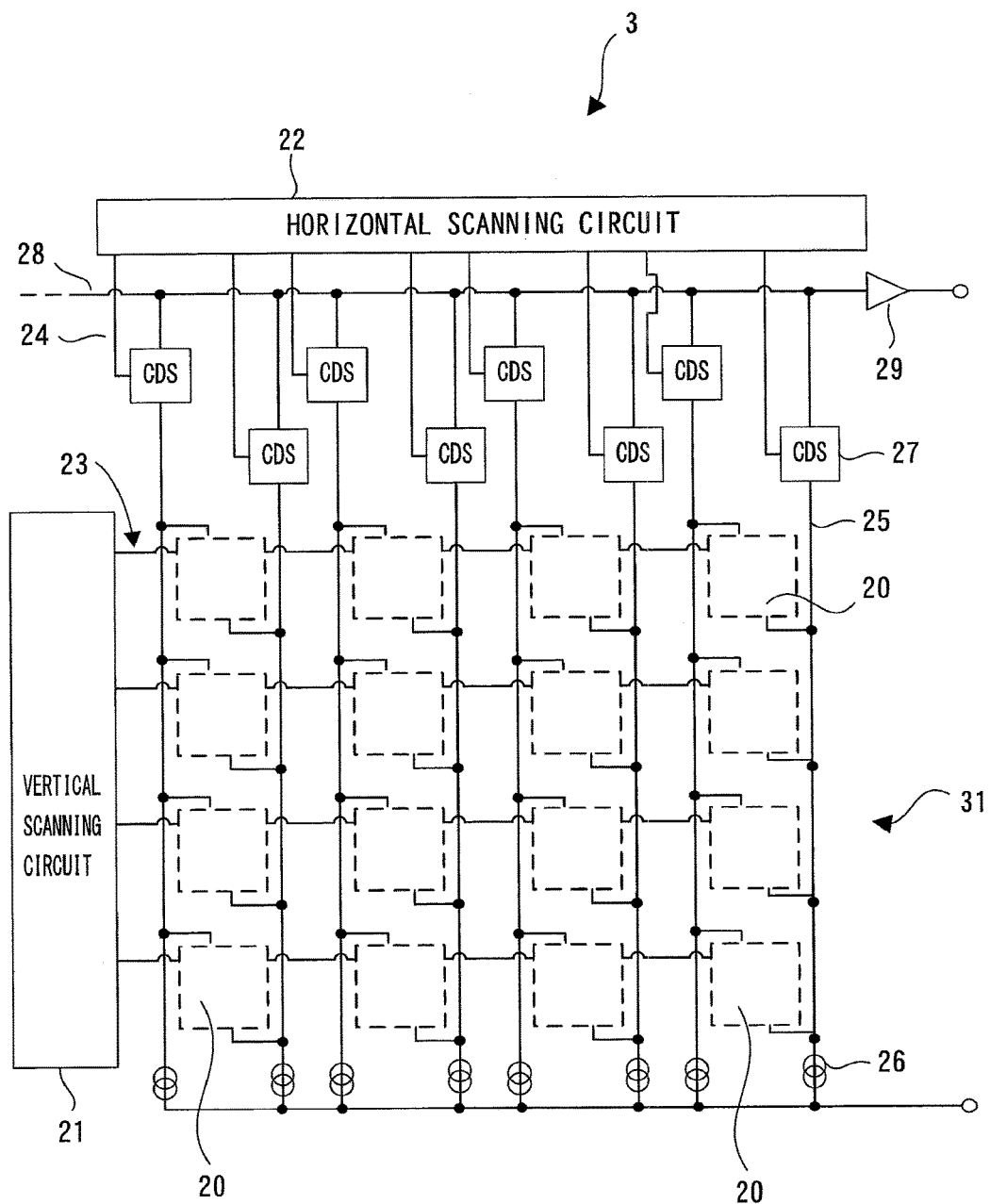

The embodiment is characterized by a feature thereof through which the extent of variance among photoelectric conversion signals output from pixels each having two photoelectric conversion units disposed thereat, in the solid-state image sensor 3, and accordingly, the following explanation will focus on the solid-state image sensor 3. FIG. 2 is a schematic illustration presenting an example of a structure that may be adopted in the solid-state image sensor 3. The solid-state image sensor 3 includes a plurality of pixels 20 disposed in a matrix pattern and peripheral circuits through which signals from the various pixels 20 are output. The image-capturing area 31 is an area where pixels 20 are disposed in a matrix pattern. While the image-capturing area 31 in the example presented in FIG. 2 assumes a 16-pixel range with pixels disposed over four horizontal rows and four vertical columns, the number of pixels that are actually disposed in the image-capturing area is far greater than that shown in FIG. 2.

Each of the pixels 20 in the solid-state image sensor 3 includes two photoelectric conversion units. When two photoelectric conversion units are disposed in each pixel among the pixels arrayed along the horizontal direction and along the vertical direction at the solid-state image sensor 3, the two photoelectric conversion units may be arranged side by side along the horizontal direction (will be referred to as a "horizontal division pixel") or may be arranged side by side along the vertical direction (will be referred to as a "vertical division pixel"). In the embodiment, horizontal division pixels are disposed through the entire image-capturing area 31. However, vertical division pixels are disposed instead of horizontal division pixels in a specific area. It is to be noted that a single reference sign 20 is used to indicate pixels in FIG. 2 without distinguishing horizontal division pixels from vertical division pixels. Each pixel 20 executes photoelectric conversion in response to a drive signal provided from a peripheral circuit and outputs photoelectric conversion signals.

The peripheral circuits include a vertical scanning circuit 21, a horizontal scanning circuit 22, drive signal lines 23 and 24 respectively connected to the vertical scanning circuit 21 and the horizontal scanning circuit 22, vertical signal lines 25 that receive signals from the pixels 20, constant current sources 26 connected to the vertical signal lines 25, correlated double sampling circuits (CDS circuits) 27, a horizontal signal line 28 that receives signals output from the CDS circuits 27, and an output amplifier 29.

The vertical scanning circuit 21 and the horizontal scanning circuit 22 each output a specific drive signal in response to an instruction issued by the image-capturing control unit 4. The individual pixels 20 are driven by a drive signal output from the vertical scanning circuit 21 and outputs photoelectric conversion signals to the vertical signal lines 25. Noise in the signals output from the pixels 20 is removed at the CDS circuits 27, and the signals having undergone noise removal are output to an external recipient via the horizontal signal line 28 and the output amplifier 29 in response to a drive signal provided from the horizontal scanning circuit 22.

Figure 3:
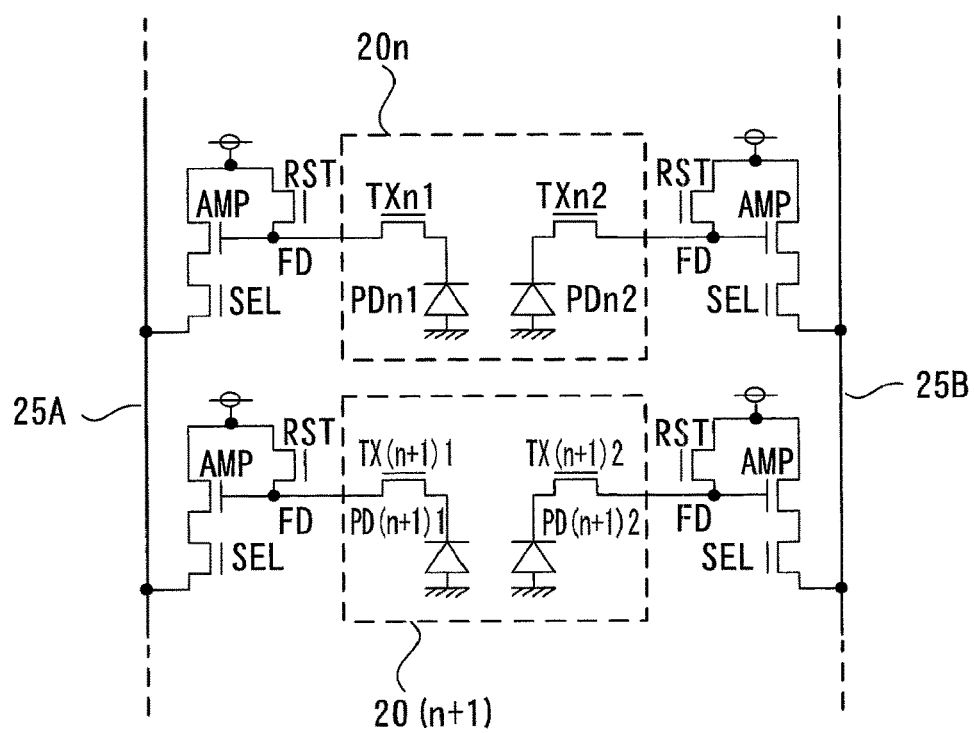

FIG. 3 is a circuit diagram pertaining to pixels 20n and 20(n+1) adjacent to each other along the vertical direction in FIG. 1. The pixel 20n in FIG. 3 includes two photodiodes PDn1 and PDn2 to function as photoelectric conversion units, disposed inside of a micro-lens (not shown). In addition, the pixel 20(n+1) includes two photodiodes PDn(n+1)1 and PD(n+1)2 to function as photoelectric conversion units, disposed inside of a micro-lens (not shown). As explained earlier, while the pixels 20 may be horizontal division pixels or vertical division pixels, the circuit diagrams for the horizontal division pixels and the vertical division pixels are identical.

The photodiodes PDn1 and PDn2 in the pixel 20n each generate an electric charge corresponding to the incident light. The signal charge generated in the photodiode PDn1 is transferred via a transfer gate Txn1 to an FD (floating diffusion) area located on the side where a vertical signal line 25A is present. The signal charge received is then converted to a voltage in the FD area. A signal corresponding to the potential in the FD area is amplified by an amplifier transistor AMP. Subsequently, it is read out via the vertical signal line 25A as a signal in a "row" selected by a "row" selector transistor SEL. A reset transistor RST is engaged in operation as a reset unit that resets the potential in the FD area.

On the other hand, the signal charge generated in the photodiode PDn2 in the pixel 20n is transferred via a transfer gate Txn2 to an FD (floating diffusion) area located on the side where a vertical signal line 25B is present. The signal charge received is then converted to a voltage in the FD area. A signal corresponding to the potential in the FD area is amplified by an amplifier transistor AMP. Subsequently, it is read out via the vertical signal line 25B as a signal in a "row" selected by a "row" selector transistor SEL. A reset transistor RST is engaged in operation as a reset unit that resets the potential in the FD area.

In addition, the photodiodes PD(n+1)1 and PD(n+1)2 in the pixel 20(n+1) each generate an electric charge corresponding to the incident light. The signals generated based upon the electric charges are read out as has been described above in reference to the pixel 20n. It is to be noted that the "row" selector transistors SEL are switched in response to a drive signal output from the vertical scanning circuit 21.

Figure 4:
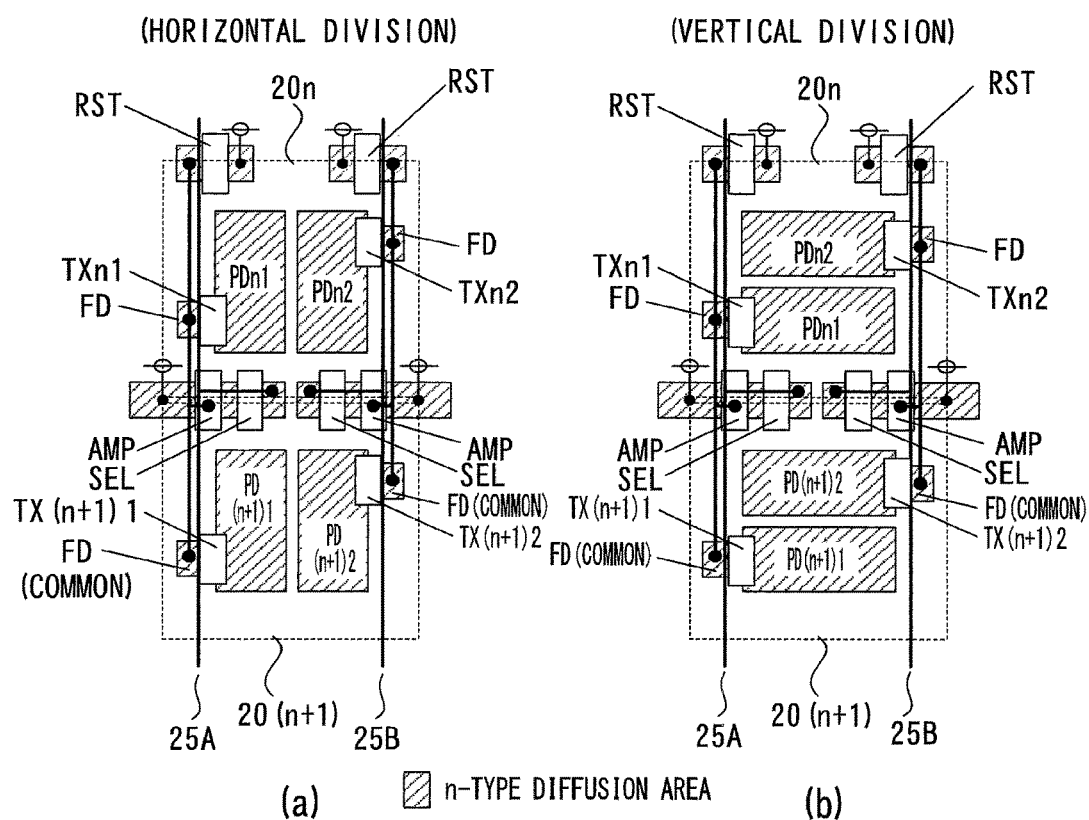
FIG. 4 A plan view presenting an example of a horizontal division structure in FIG. 4($a$) and a plan view presenting an example of a vertical division structure in FIG. 4($b$)

FIG. 4 presents plan views of examples of pixels 20n and 20(n+1) disposed adjacent to each other along the vertical direction at the solid-state image sensor 3. FIG. 4(a) shows horizontal division pixels, whereas FIG. 4(b) shows vertical division pixels.

In FIG. 4(a), the photodiodes PDn1 and PDn2, located on the left side and on the right side in the pixel 20n, assume substantially identical shapes and identical sizes. In addition, the photodiodes PD(n+1)1 and PD(n+1)2 disposed on the left side and on the right side in the pixel 20(n+1), also assume substantially identical shapes and identical sizes. Furthermore, the shapes and the sizes of the photodiodes PDn1 and PDn2 at the pixel 20n are substantially identical to the shapes and the sizes of the photodiodes PD(n+1)1 and PD(n+1)2 at the pixel 20(n+1). In other words, a horizontal division pixel 20 assumes a structure substantially identical to that of other horizontal division pixels 20.

The photodiode PDn1 in the pixel 20n and the photodiode PD(n+1)1 in the pixel 20(n+1) in the embodiment share an FD area, a reset transistor RST, a "row" selector transistor SEL and an amplifier transistor AMP located on the side where the vertical signal line 25A is present. The photodiode PDn2 in the pixel 20n and the photodiode PD(n+1)2 in the pixel 20(n+1) also share an FD area, a reset transistor RST, a "row" selector transistor SEL and an amplifier transistor AMP located on the side where the vertical signal line 25B is present. By allowing the pixels disposed adjacent to each other along the vertical line to share a plurality of transistors as described above, better efficiency is assured in the utilization of available space at the solid-state image sensor 3 for component installation.

In FIG. 4(b), the photodiodes PDn1 and PDn2, located on the upper side and on the lower side in the pixel 20n, assume substantially identical shapes and identical sizes. In addition, the photodiodes PD(n+1)1 and PD(n+1)2 disposed on the upper side and on the lower side in the pixel 20(n+1), also assume substantially identical shapes and identical sizes. Furthermore, the shapes and the sizes of the photodiodes PDn1 and PDn2 at the pixel 20n are substantially identical to the shapes and the sizes of the photodiodes PD(n+1)1 and PD(n+1)2 at the pixel 20(n+1). In other words, a vertical division pixel 20 assumes a structure substantially identical to that of other vertical division pixels 20.

Moreover, the photodiodes PDn1, PDn2, PD(n+1)1 and PD(n+1)2 in FIG. 4(a) and FIG. 4(b) take on shapes and the sizes substantially identical to one another. Namely, the shape and the size of the pixels 20, i.e., the shapes and the sizes of the two photodiodes in each pixel 20, remain substantially identical regardless of whether the pixels 20 are horizontal division pixels or vertical division pixels in the embodiment.

The photodiode PDn1 in the pixel 20n and the photodiode PD(n+1)1 in the pixel 20(n+1) in FIG. 4(b) share an FD area, a reset transistor RST, a "row" selector transistor SEL and an amplifier transistor AMP located on the side where the vertical signal line 25A is present, as do the photodiodes in FIG. 4(a). The photodiode PDn2 in the pixel 20n and the photodiode PD(n+1)2 in the pixel 20(n+1) also share an FD area, a reset transistor RST, a "row" selector transistor SEL and an amplifier transistor AMP located on the side where the vertical signal line 25B is present.

The first embodiment is characterized in that transfer gates disposed in correspondence to the photodiodes in a given pixel take positions that do not match each other and that the dimensions, i.e., the gate widths and lengths, the shapes and the installation positions of transfer gates Txn1, Txn2, Tx(n+1)1 and Tx(n+1)2 in the overall configuration remain unchanged regardless of whether the pixels are horizontal division pixels (FIG. 4(a)) or vertical division pixels (FIG. 4(b)). When an installation position remains unchanged, the positional coordinates of the transfer gate Tx, taken relative to a reference position of the pixel (e.g., the pixel center at which the diagonals of a square pixel intersect each other), remain fixed. Namely, the transfer gates Tx at a horizontal division pixel (see FIG. 4(a)) and the corresponding vertical division pixel (see FIG. 4(b)) assume identical dimensions, identical orientations and identical positions (i.e., the specific upper right positions or lower left positions at the corresponding pixels 20). Through these measures, it is ensured that the transfer gates Tx at the individual pixels 20 assume fixed positions, and thus, conditions for transferring electric charges Q from the pairs of photodiodes PD to the FD areas are equalized for all the pixels 20. In addition, since the parasitic capacitances in the transfer gates Tx are substantially equalized, substantial uniformity is achieved with regard to the FD area-side capacitance (the total of the capacitance in the FD area, the parasitic capacitance in the transfer gate Tx and the like) for all the pixels 20.

As explained earlier, the dimensions of the two photodiodes in each pixel are set substantially equal regardless of whether the pixel is a horizontal division pixel or a vertical division pixel, and thus, as long as equal amounts of light enter the photodiodes PD, substantially equal electric charges Q are generated in the photodiodes PD. Since a relationship expressed as; potential difference $V=Q/C$ generally exists, post-photoelectric conversion voltages V can be equalized among the individual photodiodes PD by substantially equalizing electric charges Q, transfer conditions for the electric charges Q and FD area-side capacitance C as described above. Namely, regardless of whether pixels are horizontal division pixels or vertical division pixels, variance among the photoelectric conversion signals output from the plurality of photoelectric conversion units can be minimized.

Minimizing the variance among the photoelectric conversion signals output from the plurality of photoelectric conversion units is equivalent to minimizing variance in the electric charge voltage conversion efficiency.

The following advantages are achieved through the first embodiment described above.

(1) The solid-state image sensor 3 comprises a pixel array that includes first pixels (horizontal division pixels) each having a first photoelectric conversion unit PDn1 and a second photoelectric conversion unit PDn2 arranged side-by-side along the horizontal direction and second pixels (vertical division pixels) each having a third photoelectric conversion unit PDn1 and a fourth photoelectric conversion unit PDn2 arranged side-by-side along the vertical direction, a first transfer gate Txn1 via which a signal charge generated in the first photoelectric conversion unit PDn1 at a first pixel is transferred to a first charge voltage conversion unit (FD area), a second transfer gate Txn2 via which a signal charge generated in the second photoelectric conversion unit PDn2 at the first pixel is transferred to a second charge voltage conversion unit (FD area), a third transfer gate Txn1 via which a signal charge generated in the third photoelectric conversion unit PDn1 at a second pixel is transferred to a third charge voltage conversion unit (FD area), and a fourth transfer gate Txn2 via which a signal charge generated in the fourth photoelectric conversion unit PDn2 at the second pixel is transferred to a fourth charge voltage conversion unit (FD area). The first transfer gate Txn1, the second transfer gate Txn2, the third transfer gate Txn1 and the fourth transfer gate Txn2 are respectively disposed at the first photoelectric conversion unit PDn1, the second photoelectric conversion unit PDn2, the third photoelectric conversion unit PDn1 and the fourth photoelectric conversion unit PDn2 so that uniform voltage conversion efficiency is achieved in the first charge voltage conversion unit (FD area), the second charge voltage conversion unit (FD area), the third charge voltage conversion unit (FD area) and the fourth charge of voltage conversion unit (FD area). As a result, variance among the photoelectric conversion signals output from the plurality of photoelectric conversion units can be minimized regardless of whether the photoelectric conversion units belong to horizontal division pixels (first pixels) or vertical division pixels (second pixels).

(2) Since the horizontal direction and the vertical direction run perpendicular to each other at the solid-state image sensor 3 described in (1) above, the present invention is highly compatible with a matrix-pattern pixel array.

(3) In the solid-state image sensor 3 described in (1) and (2) above, the first transfer gate Txn1 and the second transfer gate Txn2 in each first pixel assume substantially identical gate widths and gate lengths, the third transfer gate Txn1 and the fourth transfer gate Txn2 in each second pixel assume substantially identical gate widths and gate lengths, and the installation positions of the first transfer gate Txn1 and the second transfer gate Txn2 at the first pixel (horizontal division pixel) substantially coincide with the installation positions of the third transfer gate Txn1 and the fourth transfer gate Txn2 at the second pixel (vertical division pixel). Thus, variance among the photoelectric conversion signals output from the plurality of photoelectric conversion units can be minimized regardless of whether the photoelectric conversion units belong to horizontal division pixels or vertical division pixels.

(4) At the solid-state image sensor 3 described in (3) above, the first photoelectric conversion unit PDn1 in the first pixel, the second photoelectric conversion unit PDn2 in the first pixel, the third photoelectric conversion unit PDn1 in the second pixel and the fourth photoelectric conversion unit PDn2 in the second pixel are all formed to achieve substantially identical dimensions, the first transfer gate Txn1 and the second transfer gate Txn2 are disposed respectively at longer sides of the first photoelectric conversion unit PDn1 and the second photoelectric conversion unit PDn2 in the first pixel, and the third transfer gate Txn1 and the fourth transfer gate Txn2 are disposed respectively at shorter sides of the third photoelectric conversion unit PDn1 and the fourth photoelectric conversion unit PDn2 in the second pixel. Thus, variance among the photoelectric conversion signals output from the plurality of photoelectric conversion units can be minimized regardless of whether the photoelectric conversion units belong to horizontal division pixels or vertical division pixels.

(Variation 1)

In the first embodiment, the transfer gates Txn1, Txn2, Tx(n+1)1 and Tx(n+1)2 in first pixels assuming the horizontal division structure (see FIG. 4(a)) are respectively disposed at longer sides of the rectangular photodiodes PDn1, PDn2, PD(n+1)1 and PD(n+1)2. The transfer gates Txn1, Txn2, Tx(n+1)1 and Tx(n+1)2 of second pixels assuming the vertical division structure (see FIG. 4(b)), on the other hand, are respectively disposed at shorter sides of the rectangular photodiodes PDn1, PDn2, PD(n+1)1 and PD(n+1)2.

If the difference in the length of the side of the photodiode PD where a transfer gate Tx is disposed causes variance among conditions for transferring the electric charges Q from pairs of photodiodes PD to the FD areas in horizontal division pixels (first pixels) and vertical division pixels (second pixels) or causes a difference between FD area-side capacitances exceeding a predetermined value among the horizontal division pixels (first pixels) and the vertical division pixels (second pixels), the transfer gates Txn1, Txn2, Tx(n+1)1 and Tx(n+1)2 may be respectively disposed at corners of the photodiodes PDn1, PDn2, PD(n+1)1 and PD(n+1)2.

Figure 5:
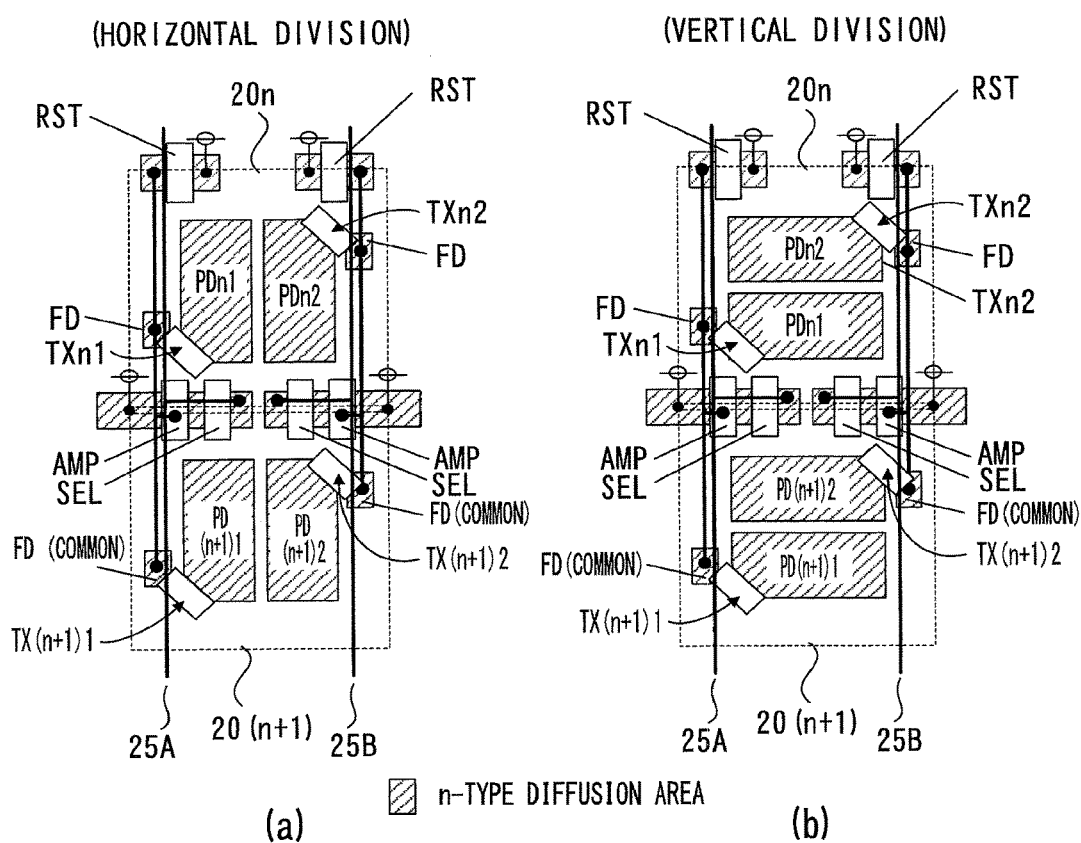
FIG. 5 A plan view presenting an example of a horizontal division structure achieved in variation 1 in FIG. 5($a$) and a plan view presenting an example of a vertical division structure achieved in variation 1 in FIG. 5($b$)

FIG. 5 presents plan views of examples of pixels 20n and 20(n+1) in variation 1. FIG. 5(a) shows an example of horizontal division pixels (first pixels), whereas FIG. 5(b) shows an example of vertical division pixels (second pixels). The variation differs from the first embodiment shown in FIG. 4(a) and FIG. 4(b) in the positions at which the individual transfer gates Tx are disposed and the angle assumed by each transfer gate Tx relative to the corresponding photodiode PD.

The transfer gates Txn1, Txn2, Tx(n+1)1 and Tx(n+1)2 are disposed respectively at corners of the photodiodes PDn1, PDn2, PD(n+1)1 and PD(n+1)2 at a 45° angle relative to the photodiodes PD. In other words, in both the horizontal division pixels (first pixels) and the vertical division pixels (second pixels), the transfer gates Txn1, Txn2, Tx(n+1)1 and Tx(n+1)2 are disposed with a uniform angle) (45°) at areas (corners), each of which connects a longer side and a shorter side, of the photodiodes PDn1, PDn2, PD(n+1)1 and PD(n+1)2 respectively.

Substantial uniformity is achieved for the horizontal division pixels (first pixels) and the vertical division pixels (second pixels) with regard to the condition for transferring the electric charges Q from the pairs of photodiodes PD to the FD areas and the FD area-side capacitance (the total of the FD area capacitance, the parasitic capacitance in the transfer gate Tx and the like). In other words, regardless of whether pixels are horizontal division pixels or vertical division pixels, variance among the photoelectric conversion signals output from the plurality of photoelectric conversion units can be minimized.

Second Embodiment

In the first embodiment, transfer gates Tx assuming uniform dimensions and uniform shape are disposed at fixed positions (predetermined positions on the upper right side and lower left side of pixels) at the individual pixels 20 regardless of whether the pixels 20 are horizontal division pixels (first pixels) or vertical division pixels (second pixels). In the second embodiment, uniformity is achieved with regard to the condition for transferring the electric charges Q from the pairs of photodiodes PD to the FD areas and the FD area-side capacitance (the total of the FD area capacitance, the parasitic capacitance in the transfer gate Tx and the like) between the horizontal division pixels and the vertical division pixels by adjusting the gate widths or the gate lengths of the transfer gates Tx or the shapes thereof, instead of disposing the transfer gates Tx at fixed positions in the horizontal division pixels (first pixels) and the vertical division pixels (second pixels).

Figure 6:
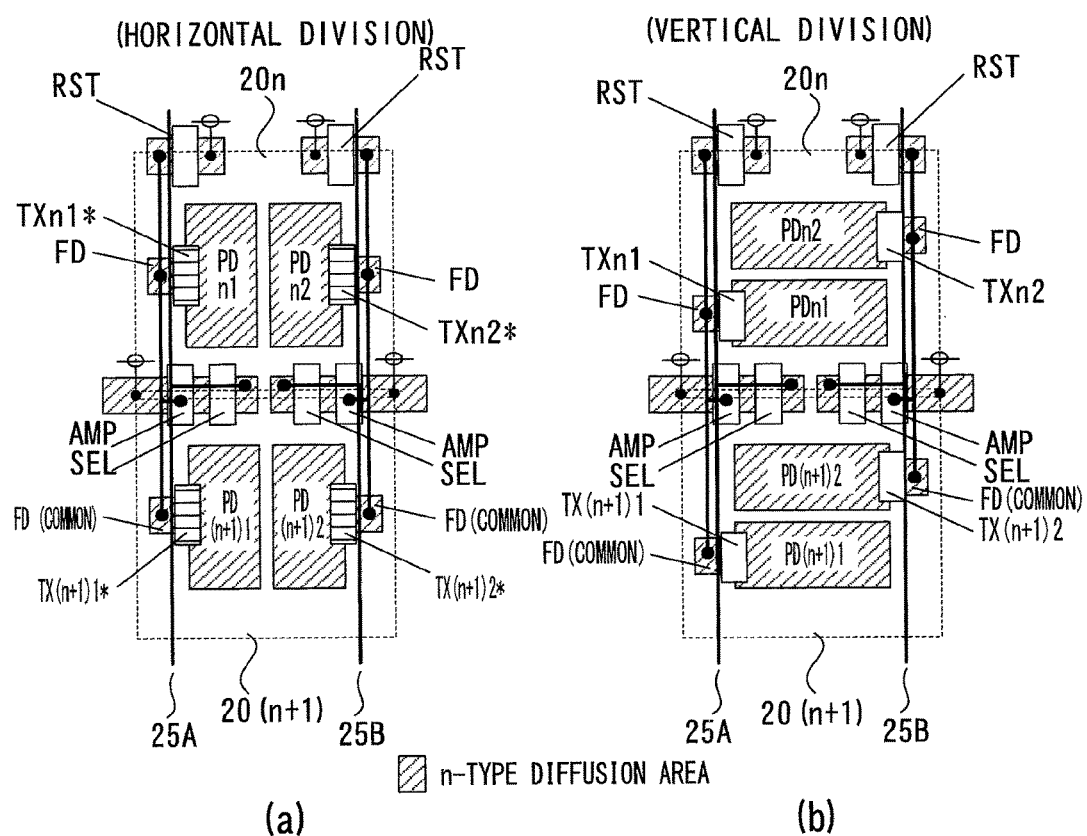
FIG. 6 A plan view presenting an example of a horizontal division structure achieved in a second embodiment in FIG. 6($a$) and a plan view presenting an example of a vertical division structure achieved in the second embodiment in FIG. 6($b$)

FIG. 6 presents plan views of examples of pixels 20n and 20(n+1) in the second embodiment. FIG. 6(a) shows horizontal division pixels, whereas FIG. 6(b) shows vertical division pixels. Transfer gates Txn1*, Txn2*, Tx(n+1)1* and Tx(n+1)2* in the horizontal division pixels shown in FIG. 6(a) are disposed at different positions and assume different dimensions in comparison to the transfer gates in the first embodiment shown in FIG. 4(a). The structural details of the vertical division pixels shown in FIG. 6(b) are identical to those of the first embodiment shown in FIG. 4(b).

In FIG. 6(a), the transfer gates Txn1*, Txn2*, Tx(n+1)1* and Tx(n+1)2* are disposed at the centers of longer sides of the photodiodes PDn1, PDn2, PD(n+1)1 and PD(n+1)2 respectively. The transfer gates Txn1, Txn2, Tx(n+1)1 and Tx(n+1)2 in FIG. 6(b), on the other hand, are disposed at the centers of shorter sides of the photodiodes PDn2, PD(n+1)1 and PD(n+1)2 respectively. The transfer gates Txn1, Txn2, Tx(n+1)1 and Tx(n+1)2 in the horizontal division pixels take on a gate width or a gate length different from that of the transfer gates in the vertical division pixels.

Figure 7:
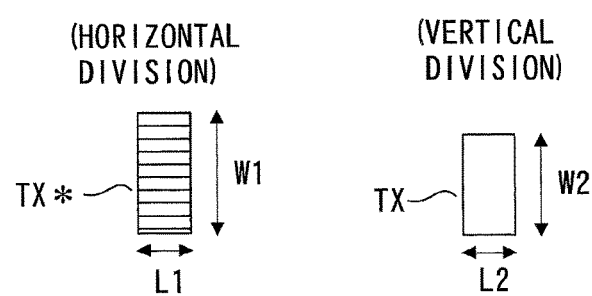
FIG. 7 An illustration comparing the dimensions assumed for the transfer gate Tx in a horizontal division pixel and in a vertical division pixel

FIG. 7 provides an illustration comparing the gate width and the gate length of a transfer gate Tx in a horizontal division pixel with those of a transfer gate Tx in a vertical division pixel. In the example presented in FIG. 7, a gate width W1 and a gate length L1 of the transfer gate Tx* in the horizontal division pixel are greater than a gate with W2 and a gate length L2 of the transfer gate Tx in the vertical division pixel.

In the second embodiment, the shape of the transfer gate Tx* is adjusted in correspondence to the size of the photodiode PD. For instance, if the length of the side of the photodiode PD at which the transfer gate Tx* is connected is greater in the horizontal division pixel than in the vertical division pixel, greater dimensions are assumed for the transfer gate Tx* in the horizontal division pixel compared to those of the transfer gate in the vertical division pixel for the following reason. When the transfer gate is disposed at a substantial center of a longer side of the photodiode PD, a greater electric charge Q will be present near the transfer gate in comparison to the electric charge Q present near a transfer gate disposed substantially at a center of a shorter side of a photodiode PD. Accordingly, by allowing the transfer gate to range over a greater area, the electric charge can be transferred with better efficiency and thus, the occurrence of transfer failure can be avoided.

Uniformity is thus achieved for the horizontal division pixels and the vertical division pixels with regard to the condition fir transferring the electric charges Q from the pairs of photodiodes PD to the FD areas (transfer failure rate) and the FD area-side capacitance (the total of the FD area capacitance, the parasitic capacitance in the transfer gate Tx and the like). In other words, regardless of whether pixels are horizontal division pixels or vertical division pixels, variance among the photoelectric conversion signals output from the plurality of photoelectric conversion units can be minimized.

The following advantages are achieved through the second embodiment described above.

(1) The solid-state image sensor 3 comprises a pixel array that includes first pixels (horizontal division pixels) each having a first photoelectric conversion unit PDn1 and a second photoelectric conversion unit PDn2 arranged side-by-side along the horizontal direction and second pixels (vertical division pixels) each having a third photoelectric conversion unit PDn1 and a fourth photoelectric conversion unit PDn2 arranged side-by-side along the vertical direction, a first transfer gate Txn1* via which a signal charge generated in the first photoelectric conversion unit PDn1 at a first pixel is transferred to a first charge voltage conversion unit (FD area), a second transfer gate Txn2* via which a signal charge generated in the second photoelectric conversion unit PDn2 at the first pixel is transferred to a second charge voltage conversion unit (FD area), a third transfer gate Txn1 via which a signal charge generated in the third photoelectric conversion unit PDn1 at a second pixel is transferred to a third charge voltage conversion unit (FD area), and a fourth transfer gate Txn2 via which a signal charge generated in the fourth photoelectric conversion unit PDn2 at the second pixel is transferred to a fourth charge voltage conversion unit (FD area). The first transfer gate Txn1*, the second transfer gate Txn2*, the third transfer gate Txn1 and the fourth transfer gate Txn2 are respectively disposed at the first photoelectric conversion unit PDn1, the second photoelectric conversion unit PDn2, the third photoelectric conversion unit PDn1 and the fourth photoelectric conversion unit PDn2, with the gate width or the gate length of at least one transfer gate among them altered so as to achieve uniformity in the voltage conversion efficiency at the first charge voltage conversion unit (FD area), the second charge voltage conversion unit (FD area), the third charge voltage conversion unit (FD area) and the fourth charge voltage conversion unit (FD area). As a result, the variance among the photoelectric conversion signals output from the plurality of photoelectric conversion units can be minimized regardless of whether the photoelectric conversion unit belong to horizontal division pixels (first pixels) and vertical division pixels (second pixels).

(2) In the solid-state image sensor 3 described in (1) above, the positions at which the first transfer gate Txn1* and the second transfer gate Txn2* are disposed at a first pixel are different from the positions at which the third transfer gate Txn1 and the fourth transfer gate Txn2 are disposed at a second pixel, the dimensions of the transfer gate made up with the first transfer gate Txn1* and the second transfer gate Txn2* and the dimensions of the transfer gate made up with the third transfer gate Txn1 and the fourth transfer gate Txn2 are varied in correspondence to the length of the sides of the first photoelectric conversion unit PDn1 and the second photoelectric conversion unit PDn2 in the first pixel at which the first transfer gate Txn1* and the second transfer gate Txn2* are disposed respectively and the length of the sides of the third photoelectric conversion unit PDn1 and the fourth photoelectric conversion unit PDn1 in the second pixel at which the third transfer gate Txn1 and the fourth transfer gate Txn2 are disposed. Thus, variance among the photoelectric conversion signals output from the plurality of photoelectric conversion units can be minimized regardless of whether the photoelectric conversion units belong to horizontal division pixels or vertical division pixels.

(Variation 2)

It is to be noted that while the transfer gates Tx in the horizontal division pixels are formed so as to achieve dimensions greater than those of the transfer gates Tx in the vertical division pixels in the second embodiment described above, variance among the photoelectric conversion signals output from the plurality of photoelectric conversion units in the horizontal division pixels and the vertical division pixels alike may be minimized by forming the transfer gates Tx in the vertical division pixels so as to achieve dimensions smaller than those of transfer gates Tx in the horizontal division pixels.

It is to be noted that the embodiments described above simply represents examples and the present invention is in no way limited to the structural particulars of these embodiments.

The disclosure of the following priority application is herein incorporated by reference: Japanese Patent Application No. 2012-232422 filed Oct. 19, 2012.

REFERENCE SIGNS LIST 1 digital camera
3 solid-state image sensor
9 microprocessor
20 pixel
21 vertical scanning circuit
22 horizontal scanning circuit
25, 25A, 25B vertical signal line
27 CDS circuit
28 horizontal signal line
29 output amplifier
AMP amplifier transistor
FD floating diffusion area
RST reset transistor
SEL row selector transistor
Tx transfer gate

The invention claimed is:
1. An image sensor, comprising:
a first photoelectric conversion area that converts light into an electric charge;
a second photoelectric conversion area that converts light into an electric charge;

a first transfer unit, having a first gate width, that transfers the electric charge of the first photoelectric conversion area to a first floating diffusion area; and a second transfer unit, having a second gate width different from the first gate width, that transfers the electric charge of the second photoelectric conversion area to a second floating diffusion area.

2. The image sensor according to claim 1, wherein:
an installation position of the first transfer unit relative to the first photoelectric conversion area is different from an installation position of the second transfer unit relative to the second photoelectric conversion area.

3. The image sensor according to claim 1, wherein:
an installation position of the first floating diffusion area relative to the first photoelectric conversion area is different from an installation position of the second floating diffusion area relative to the second photoelectric conversion area.

4. The image sensor according to claim 1, wherein:
the first photoelectric conversion area converts light from a first micro-lens into the electric charge; and
the second photoelectric conversion area converts light from a second micro-lens into the electric charge.

5. The image sensor according to claim 4, wherein:
the first photoelectric conversion area includes at least a first photoelectric conversion unit that executes photoelectric conversion and a second photoelectric conversion unit that executes photoelectric conversion; and
the second photoelectric conversion area includes at least a third photoelectric conversion unit that executes photoelectric conversion and a fourth photoelectric conversion unit that executes photoelectric conversion.

6. The image sensor according to claim 5, wherein:
the first photoelectric conversion unit and the second photoelectric conversion unit are arranged along a first direction in the first photoelectric conversion area; and
the third photoelectric conversion unit and the fourth photoelectric conversion unit are arranged along a second direction, which intersects the first direction, in the second photoelectric conversion area.

7. The image sensor according to claim 5, wherein:
the second photoelectric conversion unit is arranged in a first direction from the first photoelectric conversion unit in the first photoelectric conversion area; and
the fourth photoelectric conversion unit is arranged in a second direction from the third photoelectric conversion unit in the second photoelectric conversion area.

8. The image sensor according to claim 6, wherein:
the first transfer unit includes a first transfer gate via which electric charge of the first photoelectric conversion unit is transferred and a second transfer gate via which electric charge of the second photoelectric conversion unit is transferred; and
the second transfer unit includes a third transfer gate via which electric charge of the third photoelectric conversion unit is transferred and a fourth transfer gate via which electric charge of the fourth photoelectric conversion unit is transferred.

9. The image sensor according to claim 8, wherein:
the first transfer gate and the second transfer gate are arranged along the first direction; and
the third transfer gate and the fourth transfer gate are arranged apart in the second direction so as not to be arranged along the first direction.

10. The image sensor according to claim 8, wherein:
the first transfer gate and the second transfer gate are arranged along the first direction; and the third transfer gate and the fourth transfer gate are arranged along a third direction which intersects the first direction and the second direction.

11. The image sensor according to claim 8, wherein:
the first photoelectric conversion unit, the second photoelectric conversion unit, the first transfer gate, and the second transfer gate are arranged along the first direction in order of the first transfer gate, the first photoelectric conversion unit, the second photoelectric conversion unit, and the second transfer gate; and
the third photoelectric conversion unit, the fourth photoelectric conversion unit, the third transfer gate, and the fourth transfer gate are arranged along a third direction, which intersects the first direction and the second direction, in order of the third transfer gate, the third photoelectric conversion unit, the fourth photoelectric conversion unit, and the fourth transfer gate.

12. The image sensor according to claim 8, wherein:
the first floating diffusion area includes (i) a first charge voltage conversion unit to which the electric charge from the first photoelectric conversion unit is transferred via the first transfer gate and (ii) a second charge voltage conversion unit to which the electric charge from the second photoelectric conversion unit is transferred via the second transfer gate; and
the second floating diffusion area includes (i) a third charge voltage conversion unit to which the electric charge from the third photoelectric conversion unit is transferred via the third transfer gate and (ii) a fourth charge voltage conversion unit to which the electric charge from the fourth photoelectric conversion unit is transferred via the fourth transfer gate.

13. The image sensor according to claim 12, further comprising:
a first signal line that outputs a signal based upon a voltage of the first charge voltage conversion unit;
a second signal line that outputs a signal based upon a voltage of the second charge voltage conversion unit;
a third signal line that outputs a signal based upon a voltage of the third charge voltage conversion unit; and
a fourth signal line that outputs a signal based upon a voltage of the fourth charge voltage conversion unit.

14. An image sensor, comprising:
a first photoelectric conversion area that converts light into an electric charge;
a second photoelectric conversion area that converts light into an electric charge;
a first transfer unit, having a first gate length, that transfers the electric charge of the first photoelectric conversion area to a first floating diffusion area; and
a second transfer unit, having a second gate length different from the first gate length, that transfers the electric charge of the second photoelectric conversion area to a second floating diffusion area.

15. The image sensor according to claim 14, wherein:
an installation position of the first transfer unit relative to the first photoelectric conversion area is different from an installation position of the second transfer unit relative to the second photoelectric conversion area.

16. The image sensor according to claim 14, wherein:
an installation position of the first floating diffusion area relative to the first photoelectric conversion area is different from an installation position of the second floating diffusion area relative to the second photoelectric conversion area.

17. The image sensor according to claim 14, wherein:
the first photoelectric conversion area converts light from a first micro-lens into the electric charge; and
the second photoelectric conversion area converts light from a second micro-lens into the electric charge.

18. The image sensor according to claim 17, wherein:
the first photoelectric conversion area includes at least a first photoelectric conversion unit that executes photoelectric conversion and a second photoelectric conversion unit that executes photoelectric conversion; and
the second photoelectric conversion area includes at least a third photoelectric conversion unit that executes photoelectric conversion and a fourth photoelectric conversion unit that executes photoelectric conversion.

19. The image sensor according to claim 18, wherein:
the first photoelectric conversion unit and the second photoelectric conversion unit are arranged along a first direction in the first photoelectric conversion area; and
the third photoelectric conversion unit and the fourth photoelectric conversion unit are arranged along a second direction, which intersects the first direction, in the second photoelectric conversion area.

20. The image sensor according to claim 18, wherein:
the second photoelectric conversion unit is arranged in a first direction from the first photoelectric conversion unit in the first photoelectric conversion area; and
the fourth photoelectric conversion unit is arranged in a second direction from the third photoelectric conversion unit in the second photoelectric conversion area.

21. The image sensor according to claim 19, wherein:
the first transfer unit includes a first transfer gate via which electric charge of the first photoelectric conversion unit is transferred and a second transfer gate via which electric charge of the second photoelectric conversion unit is transferred; and
the second transfer unit includes a third transfer gate via which electric charge of the third photoelectric conversion unit is transferred and a fourth transfer gate via which electric charge of the fourth photoelectric conversion unit is transferred.

22. The image sensor according to claim 21, wherein:
the first transfer gate and the second transfer gate are arranged along the first direction; and
the third transfer gate and the fourth transfer gate are arranged apart in the second direction so as not to be arranged along the first direction.

23. The image sensor according to claim 21, wherein:
the first transfer gate and the second transfer gate are arranged along the first direction; and
the third transfer gate and the fourth transfer gate are arranged along a third direction which intersects the first direction and the second direction.

24. The image sensor according to claim 21, wherein:
the first photoelectric conversion unit, the second photoelectric conversion unit, the first transfer gate, and the second transfer gate are arranged along the first direction in order of the first transfer gate, the first photoelectric conversion unit, the second photoelectric conversion unit, and the second transfer gate; and
the third photoelectric conversion unit, the fourth photoelectric conversion unit, the third transfer gate, and the fourth transfer gate are arranged along a third direction, which intersects the first direction and the second direction in order of the third transfer gate, the third photoelectric conversion unit, the fourth photoelectric conversion unit, and the fourth transfer gate.

25. The image sensor according to claim 21, wherein:
the first floating diffusion area includes (i) a first charge voltage conversion unit to which the electric charge from the first photoelectric conversion unit is transferred via the first transfer gate and (ii) a second charge voltage conversion unit to which the electric charge from the second photoelectric conversion unit is transferred via the second transfer gate; and
the second floating diffusion area includes (i) a third charge voltage conversion unit to which the electric charge from the third photoelectric conversion unit is transferred via the third transfer gate and (ii) a fourth charge voltage conversion unit to which the electric charge from the fourth photoelectric conversion unit is transferred via the fourth transfer gate.

26. The image sensor according to claim 25, further comprising:
a first signal line that outputs a signal based upon a voltage of the first charge voltage conversion unit;
a second signal line that outputs a signal based upon a voltage of the second charge voltage conversion unit;
a third signal line that outputs a signal based upon a voltage of the third charge voltage conversion unit; and
a fourth signal line that outputs a signal based upon a voltage of the fourth charge voltage conversion unit.

27. The image sensor according to claim 7, wherein:
the first transfer unit includes a first transfer gate via which electric charge of the first photoelectric conversion unit is transferred and a second transfer gate via which electric charge of the second photoelectric conversion unit is transferred; and
the second transfer unit includes a third transfer gate via which electric charge of the third photoelectric conversion unit is transferred and a fourth transfer gate via which electric charge of the fourth photoelectric conversion unit is transferred.

28. The image sensor according to claim 27, wherein:
the first transfer gate and the second transfer gate are arranged along the first direction; and
the third transfer gate and the fourth transfer gate are arranged apart in the second direction so as not to be arranged along the first direction.

29. The image sensor according to claim 27, wherein:
the first transfer gate and the second transfer gate are arranged along the first direction; and
the third transfer gate and the fourth transfer gate are arranged along a third direction which intersects the first direction and the second direction.

30. The image sensor according to claim 27, wherein:
the first photoelectric conversion unit, the second photoelectric conversion unit, the first transfer gate, and the second transfer gate are arranged along the first direction in order of the first transfer gate, the first photoelectric conversion unit, the second photoelectric conversion unit, and the second transfer gate; and
the third photoelectric conversion unit, the fourth photoelectric conversion unit, the third transfer gate, and the fourth transfer gate are arranged along a third direction which intersects the first direction and the second direction, in order of the third transfer gate, the third photoelectric conversion unit, the fourth photoelectric conversion unit, and the fourth transfer gate.

31. The image sensor according to claim 27, wherein:
the first floating diffusion area includes a first charge voltage conversion unit to which the electric charge from the first photoelectric conversion unit is transferred via the first transfer gate and a second charge voltage conversion unit to which the electric charge from the second photoelectric conversion unit is transferred via the second transfer gate; and the second floating diffusion area includes a third charge voltage conversion unit to which the electric charge from the third photoelectric conversion unit is transferred via the third transfer gate and a fourth charge voltage conversion unit to which the electric charge from the fourth photoelectric conversion unit is transferred via the fourth transfer gate.

32. The image sensor according to claim 31, further comprising:
a first signal line that outputs a signal based upon a voltage of the first charge voltage conversion unit;
a second signal line that outputs a signal based upon a voltage of the second charge voltage conversion unit;
a third signal line that outputs a signal based upon a voltage of the third charge voltage conversion unit; and
a fourth signal line that outputs a signal based upon a voltage of the fourth charge voltage conversion unit.

33. The image sensor according to claim 20, wherein:
the first transfer unit includes a first transfer gate via which electric charge of the first photoelectric conversion unit is transferred and a second transfer gate via which electric charge of the second photoelectric conversion unit is transferred; and
the second transfer unit includes a third transfer gate via which electric charge of the third photoelectric conversion unit is transferred and a fourth transfer gate via which electric charge of the fourth photoelectric conversion unit is transferred.

34. The image sensor according to claim 33, wherein:
the first transfer gate and the second transfer gate are arranged along the first direction; and
the third transfer gate and the fourth transfer gate are arranged apart in the second direction so as not to be arranged along the first direction.

35. The image sensor according to claim 33, wherein:
the first transfer gate and the second transfer gate are arranged along the first direction; and
the third transfer gate and the fourth transfer gate are arranged along a third direction which intersects the first direction and the second direction.

36. The image sensor according to claim 33, wherein:
the first photoelectric conversion unit, the second photoelectric conversion unit, the first transfer gate, and the second transfer gate are arranged along the first direction in order of the first transfer gate, the first photoelectric conversion unit, the second photoelectric conversion unit, and the second transfer gate; and
the third photoelectric conversion unit, the fourth photoelectric conversion unit, the third transfer gate, and the fourth transfer gate are arranged along a third direction which intersects the first direction and the second direction in order of the third transfer gate, the third photoelectric conversion unit, the fourth photoelectric conversion unit, and the fourth transfer gate.

37. The image sensor according to claim 33, wherein:
the first floating diffusion area includes a first charge voltage conversion unit to which the electric charge from the first photoelectric conversion unit is transferred via the first transfer gate and a second charge voltage conversion unit to which the electric charge from the second photoelectric conversion unit is transferred via the second transfer gate; and
the second floating diffusion area includes a third charge voltage conversion unit to which the electric charge from the third photoelectric conversion unit is transferred via the third transfer gate and a fourth charge voltage conversion unit to which the electric charge from the fourth photoelectric conversion unit is transferred via the fourth transfer gate.

38. The image sensor according to claim 37, further comprising:
a first signal line that outputs a signal based upon a voltage of the first charge voltage conversion unit;
a second signal line that outputs a signal based upon a voltage of the second charge voltage conversion unit;
a third signal line that outputs a signal based upon a voltage of the third charge voltage conversion unit; and
a fourth signal line that outputs a signal based upon a voltage of the fourth charge voltage conversion unit.

* * * * *